United States Patent
Neuberger et al.

[19]

[11] Patent Number: 6,097,540

[45] Date of Patent: Aug. 1, 2000

[54] FREQUENCY CONVERSION COMBINER SYSTEM FOR DIODE LASERS

[75] Inventors: Wolfgang Neuberger, Labuan, Malaysia; Michael Quade, Bonn, Germany

[73] Assignee: CeramOptec Industries Inc., East Longmeadow, Mass.

[21] Appl. No.: 09/288,189

[22] Filed: Apr. 8, 1999

Related U.S. Application Data

[60] Provisional application No. 60/081,271, Apr. 9, 1998.

[51] Int. Cl.[7] .................................................. G02B 27/10
[52] U.S. Cl. ............................................................. 359/618
[58] Field of Search .................................... 359/618, 629, 359/636, 619, 641

[56] References Cited

U.S. PATENT DOCUMENTS

| | | | |
|---|---|---|---|
| 5,734,504 | 3/1998 | Billman | 359/618 |
| 5,790,310 | 8/1998 | Huang | 359/618 |
| 6,005,717 | 12/1999 | Neuberger et al. | 359/619 |

*Primary Examiner*—Georgia Epps
*Assistant Examiner*—Ricky Mack
*Attorney, Agent, or Firm*—Bolesh J. Skutnik; B J Associates

[57] ABSTRACT

A frequency conversion diode beam combiner system is provided to multiplex several frequency converted laser beams and therefore keep the beam-quality of a single emitter. This multiplexing is physically impossible with free propagating beams. Both transformations, the frequency conversion and the beam multiplexing, must take place in one step in a single optical component or complex. This also aids the system to be very compact. The frequency conversion diode beam combiner system delivers a single beam which consists of several multiplexed beams from the converted radiation of the diode laser emitters. The high power high beam-quality of this device is not reachable with current diode lasers. A broad range of visible and infra-red wavelengths is possible. The frequency conversion diode beam combiner system can replace high power continuous wave (cw) solid state lasers, because its design is scaleable, small and simple.

10 Claims, 5 Drawing Sheets

FREQUENCY CONVERSION COMBINER SYSTEM FOR DIODE LASERS

DOMESTIC PRIORITY UNDER 35 USC 119(E)

This application claims the benefit of U.S. Provisional Application Ser. No. 60/081271, filed Apr. 9, 1998.

BACKGROUND OF THE INVENTION

1. Field of the Invention

This invention relates to systems for frequency doubling the output of a number of diode lasers and combining the frequency-doubled output to achieve high brightness. In particular this includes frequency doubling of the laser output from diode laser arrays such that the individual beams are added together to produce high quality, high brightness frequency-doubled light.

2. Information Disclosure Statement

Nonlinear optical devices, such as harmonic generators and parametric oscillators, provide a means of extending the frequency range of available laser sources. Frequency converted solid state lasers currently fall into two categories: high power devices based on conventional solid state lasers (pumped by either flash lamps or diodes) plus frequency conversion crystals or low power devices (microlasers) based on a diode with a combination of a laser crystal and a non-linear crystal attached to it. Experimentally, low power diodes have also been directly frequency converted.

For years many groups around the world have been working to develop diode lasers directly operating in the blue/green region of the spectrum, however, with little success. Another way to reach shorter wavelengths is to use nonlinear materials, which are able, for example, to combine two photons into one which has the added frequency of the individual photons. This technique provides a comprehensive range of new wavelengths and allows building highly efficient systems.

The generation of visible light via frequency doubling has attracted growing interest over recent years, owing to its potential use in high density optical storage and in medicine. Traditionally, frequency doubling of infra-red lasers has been accomplished with nonlinear crystals which rely on birefringent phase-matching. This dependence on birefringent phase-matching has greatly restricted the range of suitable nonlinear materials as well as the range of wavelengths that can be efficiently doubled. The net result has been that cw frequency doubling efficiencies in single-pass configurations have tended to be rather low.

More recently, there has been increasing interest in the use of quasi-phase-matched nonlinear crystals. Quasi-phase-matching (QPM) has several advantages over birefringent phase-matching, including access to higher nonlinear coefficients and non-critical interaction geometries for any wavelength in the transparency range of the crystal. QPM can be achieved by an appropriate periodic modulation of the nonlinear coefficient.

Nonlinear gratings fabricated in crystals such as $KTiOPO_4$ (KTP), $LiTaO_3$ and $LiNbO_3$ have been used for blue light generation via frequency doubling both in bulk and waveguide geometries.

The output power of a single diode laser emitter is limited by the power density on the facet and the possibility to transport the generated heat away from the diode. To gain higher output power, diode laser devices consist usually of several emitters or emitter groups which are combined to an array of emitters on a substrate. This arrangement decreases the reachable beam quality in one direction by the number of the emitters. It limits the use in several application where a higher power density is necessary.

A measure of beam quality is beam propagation parameter, $M^2$, which can be calculated and analyzed to determine how well a laser beam may be focused. Generally, the highest quality beam is associated with the highest focusability to the smallest spot size, which corresponds with the highest power density. FIG. 1 shows the variables used to determine $M^2$, which is directly related to the product of a beam's minimum near-field diameter, W, and beam divergence angle, $\theta$, in the far field for a specific emission wavelength, $\lambda$:

$$M^2 = \pi W \theta / 4\lambda \tag{1}$$

Laser beams with $M^2=1$ are ideal, and larger $M^2$ values indicate decreasing focusability of a laser beam; $M^2$ values less than 1 are unattainable.

The near field is the region at, or very close to the output aperture of the diode laser emitter, which is characterized by disordered phase fronts, and is often called the Fresnel zone. In the near field, shape, size, profile and divergence can vary rapidly with distance along the beam path. The extent of the near field depends on the laser type and for a highly divergent source such as a diode laser, it can be as short as a few microns from the output facet. In contrast, the near field of an excimer laser might be many meters. To attain the highest brightness (power density) the laser beam needs to be captured at its smallest area, which, generally for a divergent beam, is as close as possible to the emitter.

At longer propagation distances from the laser, the phase fronts become ordered, leading to stable beam characteristics. This is known as the far field, or Fraunhofer zone. A very rough approximation of the distance to the onset of the far field region can be obtained by taking the square of the beam's minimum near field diameter, W, divided by the wavelength, $\lambda$:

$$F = W^2 / \lambda \tag{2}$$

For example, for a typical HeNe laser having a circular output (W=1 mm, $\lambda$=632.8 nm), the distance to the far-field begins at about 1.5 m, while for a typical YAG laser having a circular output (W=10 mm, $\lambda$=1064 nm), the far field distance begins nearly 100 m from the source.

The quality of a diode laser beam is typically examined with respect to the fast axis, which is the high divergence axis, perpendicular to the pn-plane of a semiconductor diode, and with respect to the slow axis, which is the lower divergence axis, parallel to the pn-plane of a semiconductor diode. FIG. 2 shows that emitted laser beam 24 from semiconductor laser diode 21 propagates along the z-axis and diverges rapidly along the y-axis, termed the fast axis, which is along the minor axis of diode laser stripe 23. Concurrently, emitted laser beam 24 diverges slower along the x-axis, termed the slow axis, which is along the major axis of diode laser stripe 23. Near the source, emitted laser beam 24 is elliptically shaped with the x-axis being the long axis. The minimum near field diameter, W, is therefore different along the fast and slow axes. For $M^2_{slow}$ calculations, W is assumed to be the effective diameter along the major axis, or x-axis, and for $M^2_{fast}$ calculations, W is assumed to be the effective diameter along the minor axis, or y-axis. Since the effective diameter, W, is so much larger along the slow axis compared to the fast axis, $M^2_{slow}$ typically are larger than $M^2_{fast}$, indicating that beam quality is greater along the fast axis. $M^2$ for a beam is equal to the square root of the product of the $M^2$ values for both axes, i.e. $M^2=(M^2_{fast}M^2_{slow})^{1/2}$.

As emitted laser beam 24 propagates away from the source, it diverges more rapidly along the y-axis than the x-axis. After some distance, laser beam 24 will be circular for an instant, and thereafter, the long axis of the ellipse becomes the y-axis. Generally, for many high power laser diodes, the fast axis diverges at about 40° and the slow axis diverges at about 20°.

Adding diode laser emitters to form an array normally leads to an $M^2$ value for the "enveloped" beam where "enveloped" is used to describe the combined beams of the diode laser emitters, and is given by:

$$M^2_{enveloped} > \Sigma M^2_n \quad (3)$$

where n is the number of emitters. $M^2_{enveloped}$ increases as the effective width of the "enveloped" beam increases, and is greater than the sum of the $M^2$ values for the individual beams because the effective width includes the space between the emitters. It thus would be advantageous to increase beam quality by employing suitable optics to combine the beams and limit the effects of the space between the emitters. If the beams can efficiently be combined, $M^2_{enveloped}$ can be decreased, and therefore, greater power density and beam brightness is available at a work or treatment site. The minimum value of such an $M^2_{enveloped}$ is still the sum of the individual $M^2$.

Another limitation of currently used diode laser systems is the wavelength. Until now the green/blue spectral area has not been reliably achievable. On the other hand diodes in the near infra-red area are available and reliable.

Thus far the solutions to these limitations/problems are either complex and inefficient and/or the output power and output wavelength are very limited. It is the object of this invention to solve these problems.

SUMMARY AND OBJECTIVES OF THE INVENTION

It is therefore an object of this invention to provide a novel family of laser systems that (a) are scaleable in output power, (b) have a beam quality better than a mere sum of beam quality of the multiple emitter beams, (c) are efficient, (d) are comparably simple in their architecture and (e) are capable of generating a wide range of wavelengths. There are other specific objects of the invention which arise out of the preferred embodiments described below.

Briefly stated the present invention provides a frequency conversion diode beam combiner system to multiplex several frequency converted laser beams and therefore keep the beam-quality of a single emitter. This multiplexing is physically impossible with free propagating beams. Both transformations, the frequency conversion and the beam multiplexing, must take place in one step in a single optical component or complex. This also aids the system to be very compact. The frequency conversion diode beam combiner system delivers a single beam which consists of several multiplexed beams from the converted radiation of the diode laser emitters. The high power high beam-quality of this device is not reachable with current diode lasers. A broad range of visible and infra-red wavelengths is possible. The frequency conversion diode beam combiner system can replace high power continuous wave (cw) solid state lasers, because its design is scaleable, small and simple.

The above, and other objects, features and advantages of the present invention will become apparent from the following detailed description read in conjunction with the accompanying drawings.

DISCLOSURE OF PREFERRED EMBODIMENTS

Figure 1:
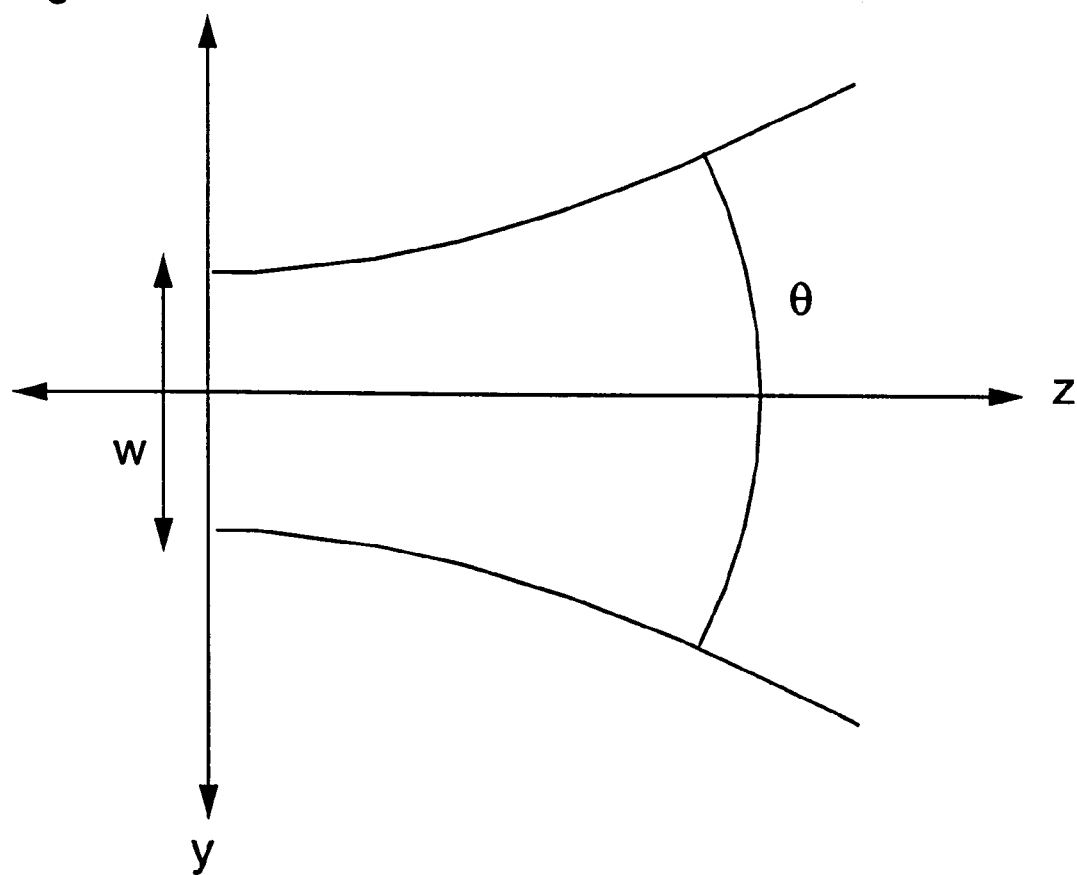
FIG. 1 illustrates the variables employed in beam quality determinations.
Figure 2:
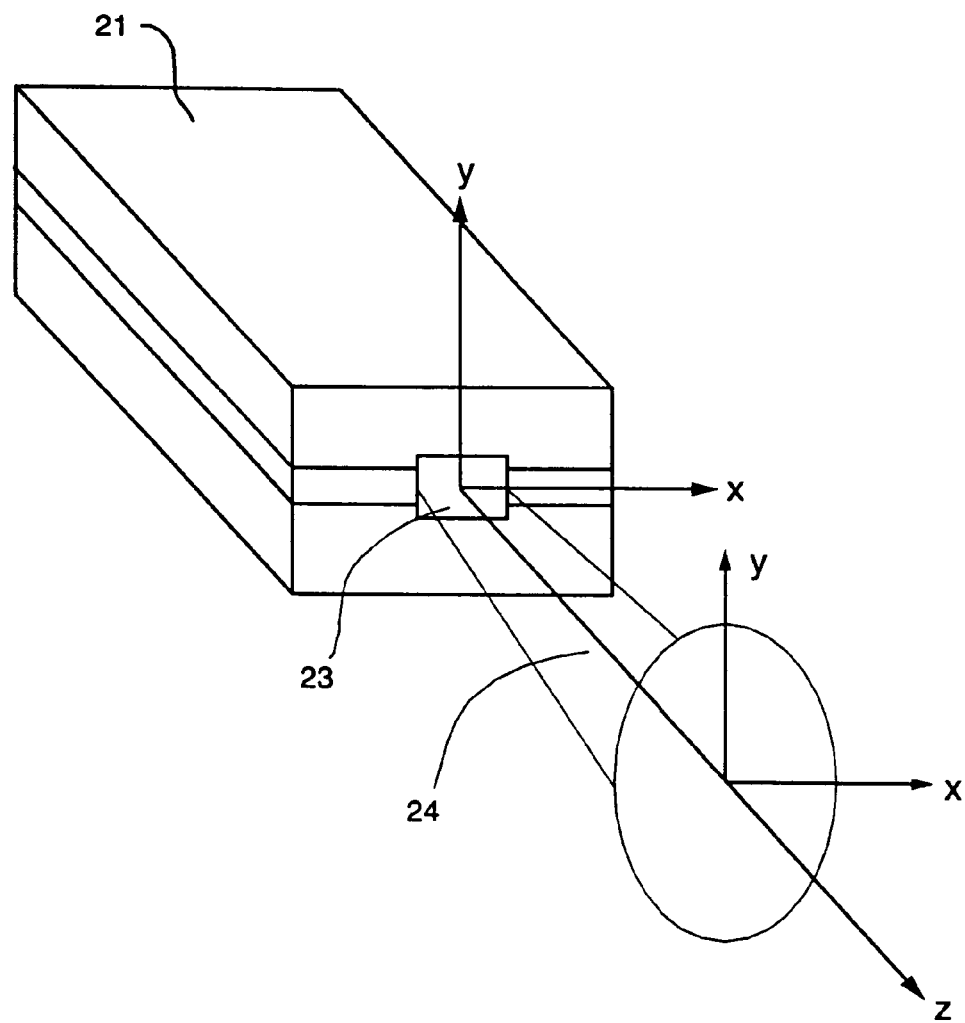
FIG. 2 displays the output laser beam of a typical semiconductor laser diode.

The invention requires the availability of nonlinear crystals capable of quasi-phase matching and thus exhibit a much higher nonlinear coefficient than conventional nonlinear crystals. This leads to a more efficient frequency conversion without the need to increase the power density in the nonlinear crystal. Because of the extra cavity frequency converting the novel system has no chaotically power fluctuations in the GHz area like other systems do because of their nonlinear coupling between longitudinal oscillator modes.

Quasi-phase matched second harmonic generation can potentially convert high-power semiconductor laser output to the visible wavelength output with 50% optical-to-optical conversion efficiency in a single-pass bulk configuration, using electric-field-poled lithium niobate. Lithographically-defined electrode structures on the positive or negative polar faces of this crystal are used to control the formation of domains under the influence of electric fields applied using those electrode structures. The quality of the resulting domain patterns not only controls the efficiency of quasi-phase matched second harmonic generation, but also controls the degree of resistance to photorefractive damage.

It is known that nonlinear optical devices, such as harmonic generators and parametric oscillators, provide a means of extending the frequency range of available laser sources. Frequency converted solid state lasers currently fall into two categories: high power devices based on conventional solid state lasers (either lamp or diode pumped) and frequency conversion crystals, or low power devices (microlasers) based on a diode with a combination of a laser crystal and a non-linear crystal attached to it. Experimentally low power diodes have also been directly frequency converted.

The possibility for highly efficient frequency conversion has been enhanced by novel types of high power diode lasers which have recently become available. The newest source is a so called tapered diode laser which works like a master oscillator power amplifier (MOPA) but without a gap between the master oscillator and the power amplifier. To achieve excellent beam quality the laser consists of two areas. The first active zone has dimension so that only one transverse mode can oscillate in the pn-plane. The second area is a power amplifier, where the radiation is amplified in a single pass. The diode consists as an example of InGaAs/AlGaAs/GaAs material. The radiation output of such a device has been found to be efficiently frequency converted with a periodically poled crystal.

The use of nonlinear crystals which have a much higher nonlinear coefficient than conventional nonlinear crystals in conjunction with quasi-phase matching, operating without an internal cavity leads to a more efficient frequency conversion without the need to increase the power density.

Because of the extra cavity frequency converting the novel system has no chaotically power fluctuations in the GHz area like further systems because of their nonlinear coupling between longitudinal oscillator modes.

The frequency conversion beam combiner consists of the following optically connected components: a high beam quality ($M^2<3$ in the pn-plane (slow axis), $M^2<2$ in the fast axis), $M^2_n<2.5$, where n denotes the number of emitters, high power (P>100 mW/emitter) multiple diode laser source (a source); a beam transformation optic (an optic); a frequency convention crystal component (crystal); and a combiner optics assembly (a combiner), where $M^2$, as described in the background section, is a measure of the beam quality with $M^2=1$ being the ideal value, i.e. the best figure of merit and unattainable in the real world.

Figure 3:
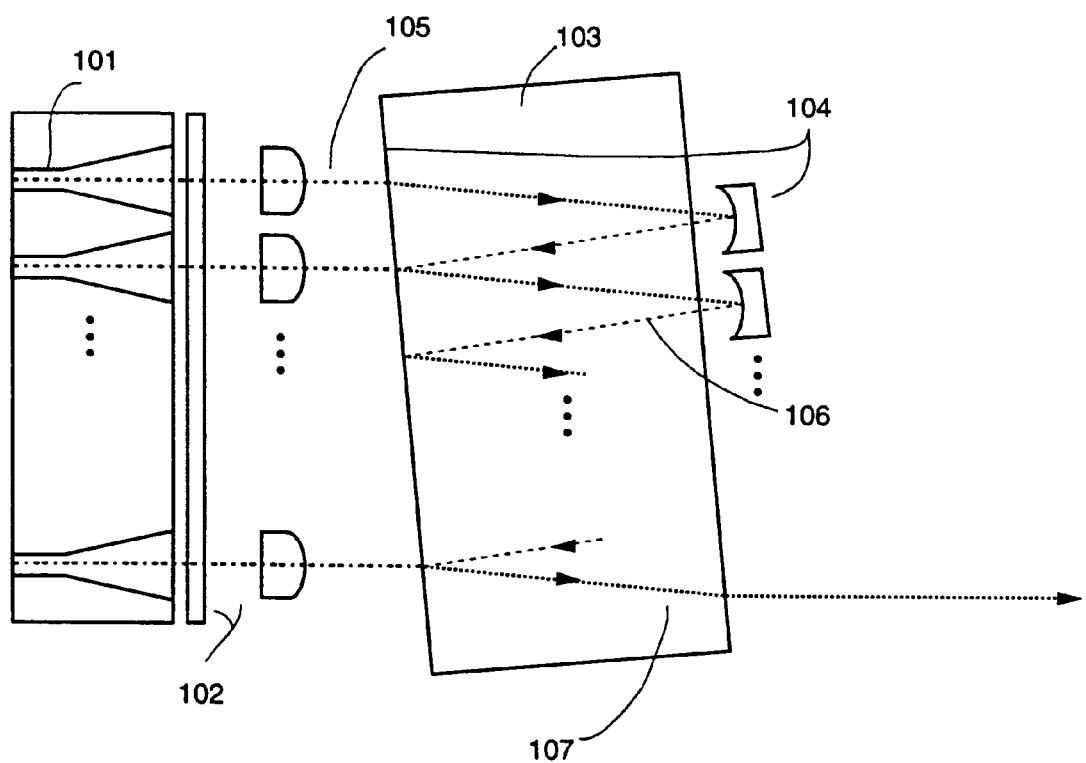
FIG. 3 presents a schematic view for a general example of a frequency conversion beam combiner system.

An example of the general architecture is given in FIG. 3, where the various key components are given by the following:

101 source (e.g. MOPA (Master Oscillator Power Amplifier) device), 102 optics (e.g. spherical and cylindrical microlenses), 103 crystal (e.g. PPLN (periodical poled LiNbO$_3$)), 104 combiner (e.g. mirror array and dichroic coated surface on crystal), 105 fundamental beam, 106 frequency converted beam, and 107 overlaid fundamental and frequency converted beams.

Figure 4:
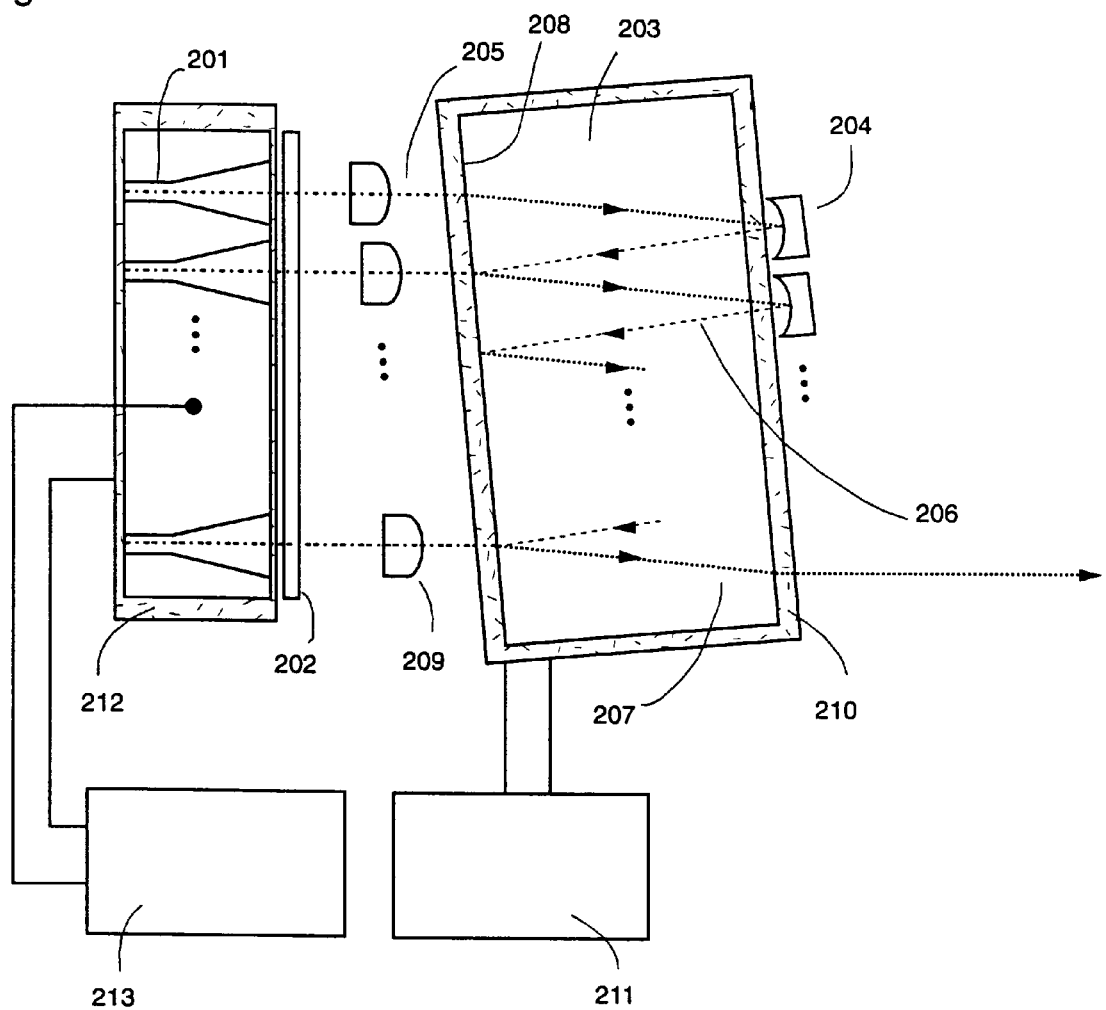
FIG. 4 shows a schematic view of the invention where the output is a green beam with a continuous wave output power of 10 watts as described in Example 1.

The invention will be more fully understood from the following examples:

One preferred embodiment is given in FIG. 4 and Example 1 below.

EXAMPLE NO. 1 a green CW P=10 W output power laser assembly.

The high power frequency conversion diode beam combiner with a wavelength in the green spectral area consists of the following elements:

A source which is a high power MOPA or tapered diode laser array 201. An optic which is cylindrical mircolens 202 with a high numerical aperture and a short focus length and array of spherical mircolenses 209 which are focusing each diode laser beam 205 inside nonlinear crystal 203 which is a PPLN (periodical poled LiNbO$_3$) and converts the wavelength of the fundamental, near infrared wavelength, to the green spectral area. A combiner which consists of an array of spherical mirrors 204 which reflects frequency converted beam 206 back into to crystal 203 and dichroitic coated surface 208 of the crystal which is highly reflective for the converted wavelength and highly transmissive for the fundamental wavelength. The nonlinear crystal is mounted on or in oven 210 which provides possible crystal structure damages while heating to a temperature which is higher than T=400 K. The temperature of the oven is controlled below this temperature by driver 211. The diode laser array 201 is cooled by TE coolers 212 and it is driven by a controllable power supply 213. Operating this system to obtain the 10 W green output the beam quality satisfies the criteria $M^2_{slow}<3$ in the pn direction, slow axis, $M^2_{fast}<2$ in the other direction, fast axis, and $M^2<2.5$.

Figure 5:
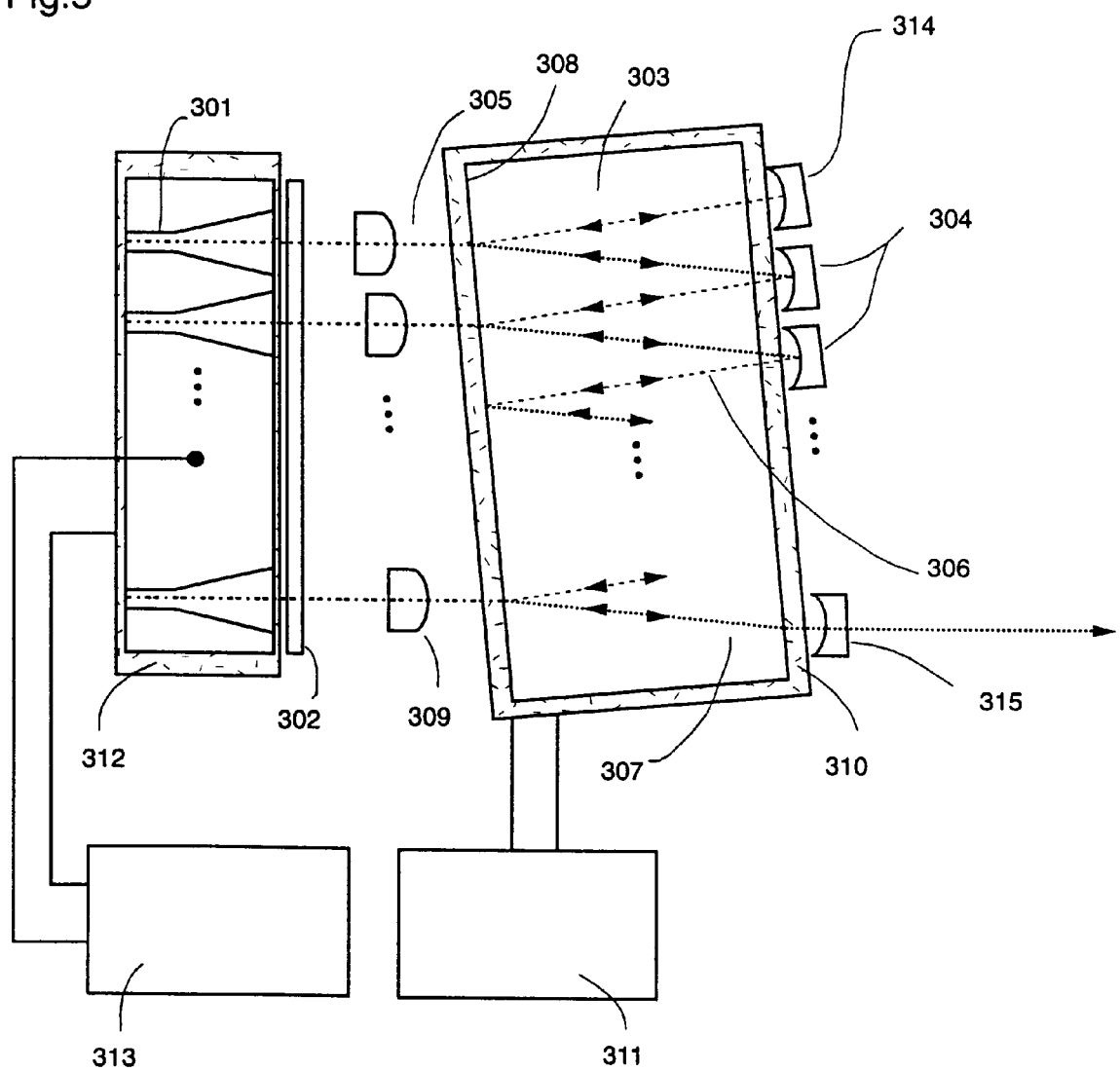
FIG. 5 illustrates a schematic view of a shaped optical parametric oscillator, another preferred embodiment described in Example 2.

Another embodiment of the invention is given in FIG. 5 and Example 2 below.

EXAMPLE NO. 2 a Shaped Optical Parametric Oscillator (SOPO)

The high power frequency conversion diode beam combiner with a wavelength in the eye-safe near infrared spectral area consists of the following elements: A source which is a high power MOPA or tapered diode laser array 301. An optic which is a cylindrical mircolens 302 with a high numerical aperture and a short focus length and an array of spherical mircolenses 309 which are focusing each diode laser beam 305 inside the nonlinear crystal 303 which is a PPLN (periodical poled LiNbO$_3$) and converts the wavelength of the fundamental, near infrared wavelength, to the eye-safe near infrared spectral area. A combiner which consists of an array of spherical mirrors 304 and 314 which reflects the frequency converted beam 306 back into to crystal 303 and a dichroitic coated surface 308 of the crystal which is highly reflective for the converted wavelength and highly transmissive for the fundamental wavelength. A output coupler 319 which couples a fractal part of the oscillating frequency converted beam out. The nonlinear crystal 303 is mounted on or in an oven 310 which provides possible crystal structure damages while heating to a temperature which is higher than T=400 K. The temperature of the oven is controlled by a driver 311. The diode laser array 301 is cooled by TE coolers 312 and it is driven by a controllable power supply 313. The beam quality of the beam, $M^2n$, being less than 2.5

Having described some preferred embodiments of the invention with reference to the accompanying drawings, it is to be understood that the invention is not limited to the precise embodiments, and that various changes and modifications may be effected therein by skilled in the art without departing from the scope or spirit of the invention as defined in the appended claims.

What is claimed is:

1. A frequency coversion combiner system for a multiple diode laser source comprising:

a diode laser having more than one emitter, each emitter having a beam quality, $M^2<2.5$, at its emitting surface;

wherein beam quality parameter, $M^2$, satifies the relationship, $M^2=\pi W\theta/4\lambda$, with W being a beam's minimum near-field diameter, $\theta$ being said beam's divergence angle in the far field for a specific emission wavelength $\lambda$, beam transform optics;

a quasi-phase matching crystal having a large nonlinear optical coversion coefficient;

a beam combiner, whose optics multiplex said more than one emttier's beams into an output beam having a beam quality, $M^2_n$, substantially equal to or less than 2.5;

wherein subscript, n, denotes how many emitters are present in said diode laser; and said elements being optically aligned and fitted in said system to achieve said beam quality.

2. A frequency conversion beam combiner system according to claim 1 wherein said crystal is a periodically poled nonlinear crystal.

3. A frequency conversion beam combiner system according to claim 1 wherein said source is a high power Master Oscillator Power Amplifier (MOPA) diode laser array with each emitter having an output power, P>100 mW.

4. A frequency conversion beam combiner system according to claim 1 wherein said source is a high power tapered diode laser array with each emitter having an output power, P>100 mW.

5. A frequency conversion beam combiner system according to claim 1 wherein said source is a high power diode laser array with each emitter having an output power, P>100 mW.

6. A frequency conversion beam combiner system according to claim 1 wherein said crystal is a nonlinear crystal with at least one dichroitic coating.

7. A frequency conversion beam combiner system according to claim 1 wherein said combiner consists of a dichroitic element, a retroreflective element, and an output window.

8. A frequency conversion beam combiner system according to claim 7 wherein said output window consists of a antireflective coated area where a coating that is antireflective for the converted wavelength is present.

9. A frequency conversion beam combiner system according to claim 7, wherein at least one of said retroreflective element is an array of mirrors with curved surfaces.

10. A frequency conversion beam combiner system according to claim 1, wherein said beam transform optics include cylindrical and spherical lenses.

* * * * *